(12) United States Patent
Bueb et al.

(10) Patent No.: US 8,683,270 B2
(45) Date of Patent: Mar. 25, 2014

(54) SIGNAL LINE TO INDICATE PROGRAM-FAIL IN MEMORY

(75) Inventors: Chris Bueb, Folsom, CA (US); Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 220 days.

(21) Appl. No.: 12/770,599

(22) Filed: Apr. 29, 2010

(65) Prior Publication Data

US 2011/0271165 A1    Nov. 3, 2011

(51) Int. Cl.
*G06F 11/00*    (2006.01)

(52) U.S. Cl.
USPC ............... 714/42; 714/25; 714/48; 714/57

(58) Field of Classification Search
USPC ................................ 714/42, 25, 48, 57
See application file for complete search history.

(56) References Cited

U.S. PATENT DOCUMENTS

| | | | | |
|---|---|---|---|---|
| 5,377,334 A | * | 12/1994 | Boldt et al. | 710/110 |
| 5,598,531 A | * | 1/1997 | Hill | 726/24 |
| 6,505,306 B1 | * | 1/2003 | Blackmon et al. | 714/6.1 |
| 6,681,358 B1 | * | 1/2004 | Karimi et al. | 714/733 |
| 7,024,598 B2 | | 4/2006 | Jeong et al. | |
| 7,158,521 B2 | * | 1/2007 | Morita et al. | 370/394 |
| 7,242,615 B2 | | 7/2007 | Nagashima | |
| 7,272,757 B2 | * | 9/2007 | Stocken | 714/718 |
| 7,286,400 B2 | | 10/2007 | Kojima et al. | |
| 7,305,596 B2 | | 12/2007 | Noda et al. | |
| 7,657,698 B2 | * | 2/2010 | Hawkins | 711/103 |
| 7,952,958 B2 | | 5/2011 | Yanagidaira et al. | |
| 8,127,181 B1 | * | 2/2012 | Shebanow et al. | 714/38.13 |
| 8,289,788 B2 | * | 10/2012 | Asauchi | 365/189.17 |
| 8,351,262 B2 | * | 1/2013 | Park | 365/185.11 |
| 2002/0046251 A1 | * | 4/2002 | Siegel | 709/213 |
| 2002/0144001 A1 | * | 10/2002 | Collins et al. | 709/250 |
| 2003/0046622 A1 | * | 3/2003 | Whetsel | 714/724 |
| 2004/0212405 A1 | * | 10/2004 | Deas et al. | 327/108 |
| 2005/0002258 A1 | * | 1/2005 | Iwase et al. | 365/222 |
| 2005/0038976 A1 | * | 2/2005 | Miller | 712/207 |
| 2005/0091561 A1 | * | 4/2005 | Lee | 714/718 |
| 2005/0210301 A1 | * | 9/2005 | Nokkonen | 713/300 |
| 2006/0087887 A1 | * | 4/2006 | Kameda et al. | 365/185.21 |
| 2006/0242488 A1 | * | 10/2006 | You | 714/718 |
| 2007/0047366 A1 | * | 3/2007 | Lee | 365/230.03 |
| 2007/0258298 A1 | * | 11/2007 | Amidon et al. | 365/201 |
| 2007/0260946 A1 | * | 11/2007 | Ullrich et al. | 714/718 |
| 2008/0002468 A1 | * | 1/2008 | Hemink | 365/185.17 |
| 2008/0126876 A1 | * | 5/2008 | Lee | 714/42 |
| 2008/0137435 A1 | * | 6/2008 | Kim et al. | 365/185.22 |
| 2008/0168233 A1 | * | 7/2008 | Luc et al. | 711/133 |
| 2008/0266991 A1 | * | 10/2008 | Lee et al. | 365/203 |
| 2008/0320209 A1 | * | 12/2008 | Lee et al. | 711/103 |
| 2009/0063758 A1 | * | 3/2009 | Chang et al. | 711/103 |
| 2009/0141560 A1 | * | 6/2009 | Park et al. | 365/185.22 |
| 2009/0228739 A1 | * | 9/2009 | Cohen et al. | 714/6 |
| 2009/0307413 A1 | * | 12/2009 | Chu | 711/103 |
| 2009/0321816 A1 | * | 12/2009 | Son et al. | 257/326 |
| 2010/0005376 A1 | * | 1/2010 | LaBerge et al. | 714/819 |
| 2010/0083050 A1 | * | 4/2010 | Ohyama | 714/42 |
| 2010/0205517 A1 | * | 8/2010 | Lee et al. | 714/807 |
| 2010/0218073 A1 | * | 8/2010 | Kang et al. | 714/764 |

(Continued)

*Primary Examiner* — Loan L. T. Truong
(74) *Attorney, Agent, or Firm* — Knobbe, Martens, Olson & Bear, LLP

(57) ABSTRACT

Subject matter disclosed herein relates to a memory device and a method of operating same.

19 Claims, 4 Drawing Sheets

(56) References Cited

U.S. PATENT DOCUMENTS

| | | | |
|---|---|---|---|
| 2010/0241282 A1* | 9/2010 | Culshaw et al. | 700/295 |
| 2010/0241795 A1* | 9/2010 | Kudo et al. | 711/103 |
| 2010/0250828 A1* | 9/2010 | Ahlquist | 711/103 |
| 2010/0332700 A1* | 12/2010 | Fallon | 710/68 |

\* cited by examiner

SIGNAL LINE TO INDICATE PROGRAM-FAIL IN MEMORY

BACKGROUND

1. Field

Subject matter disclosed herein relates to a memory device and a method of operating same.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories, SRAM, DRAM, and phase-change memory, just to name a few examples. In general, writing or programming processes may be used to store information in such memory devices, while a read process may be used to retrieve stored information.

Occasionally during operation of a memory device, a process of writing and/or programming information to a memory array may fail. Such a failure need not necessarily lead to a fatal operational error if a memory device includes safeguards such as error correction and/or an ability to re-initiate a read and/or write process, for example. An efficiency and/or reliability of such safeguards, however, may at least partially rely on a detection of write/program failures.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
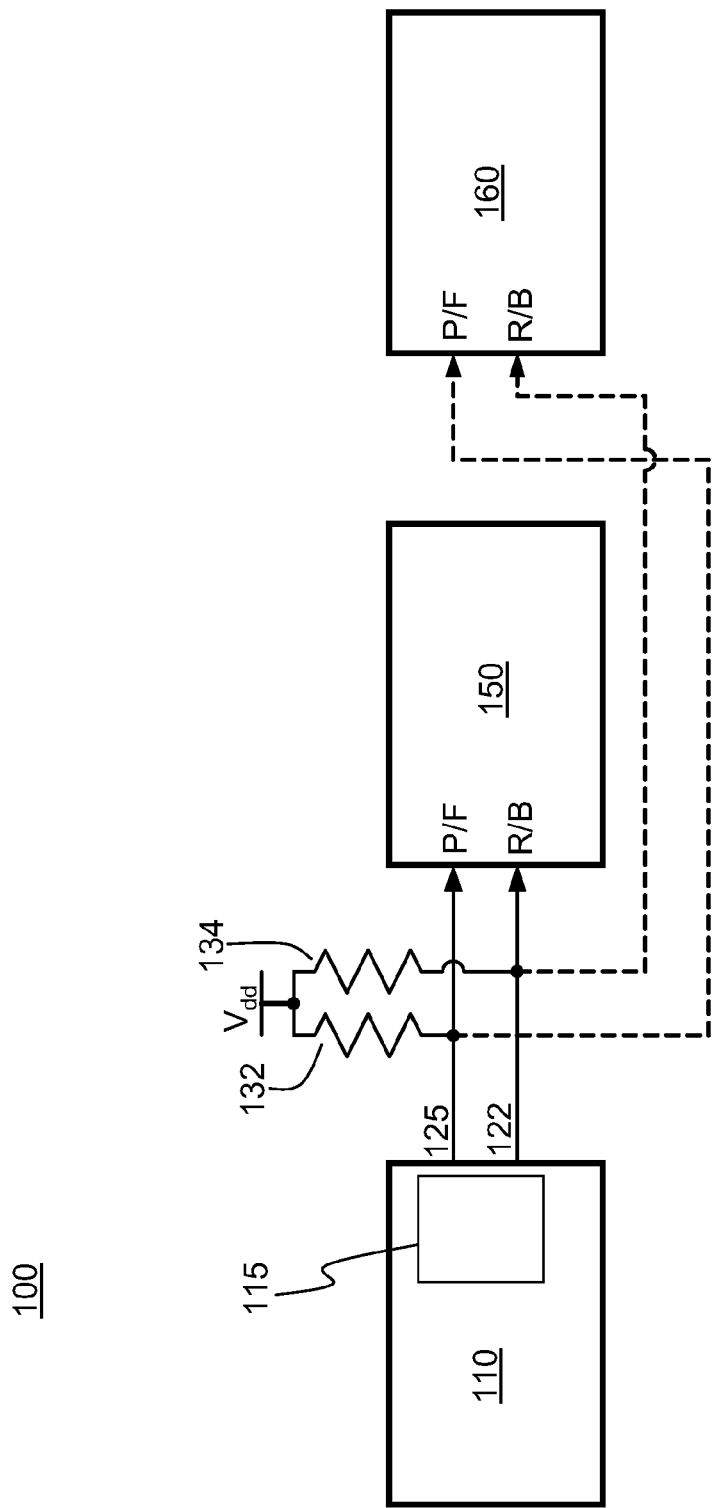
FIG. 1 is a schematic block diagram of a memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device may generate an asynchronous electronic fail signal to indicate whether a pending program or write operation has at least partially failed. Such a failure may be due to a failure in memory media of the memory device. For example, non-volatile memory (NVM) devices may include a relatively small number of non-programmable memory elements or memory cells, which may be worn-out and/or defective. Accordingly, an asynchronous fail signal to indicate failure of a pending program operation may provide a technique for managing such failures without involving a process wherein a controller and/or processor polls status registers of a number of NVM devices for successful program completion. An ability to avoid such a polling process may be beneficial in that polling may tie-up a memory bus that may otherwise be used for other memory operations during a program operation. Thus, avoiding a polling process by utilizing an asynchronous electronic fail signal to indicate failure of a pending program operation may improve memory speed. Such improved speed may be increasingly noticeable as the number of parallel NVM devices in a memory device increases, for example.

In a particular embodiment, if a portion of memory fails to successfully be programmed in response to a program operation, an asynchronous fail signal may be generated to notify a controller and/or processor of the failure. Subsequent to such notification, a controller and/or processor may manage a failure in a number of ways. For example, a controller and/or processor may remap a failed portion of memory and repeat a program operation to write to the remapped memory. In one implementation, an asynchronous fail signal may be implemented using a fail signal line having an open-collector configuration. Such a fail signal line may be connected to individual NVM devices and to a controller and/or processor. In a particular implementation, a fail signal line may be connected to individual NVM devices comprising a group of devices that share a common chip enable signal, for example. Thus, if any one or more of such NVM devices in a particular group is involved in a write-fail event, the fail signal line may be pulled low.

In an embodiment, a memory system may comprise a ready-busy (R/B) signal line to carry an R/B signal. Such an R/B signal may indicate that a program operation is pending and has not completed (successfully or not). For example, an R/B signal may be implemented using an open-drain configuration so that a logic low value may indicate a pending program operation. After the program operation has finished, the R/B signal may transition to a logic high value to indicate completion of the program operation. Similar to the case for a fail signal line, an R/B signal line may connect to individual NVM devices. Such an R/B signal line may be useful, for example, for memory devices that involve write latencies that vary from time to time, such as for NOR, NAND, and PCM memory devices, just to name a few examples.

In an embodiment, a method of operating a memory system may comprise maintaining an R/B signal to indicate a pending program operation of one or more memory devices, and determining a program-fail event for any of the one or more memory devices during the pending program operation. While maintaining the ready-busy signal, particular implementations may also comprise generating an asynchronous fail signal to indicate that the program operation was unsuccessful. In a particular implementation, after generating such a fail signal, a value of the R/B signal may transition to indicate conclusion of the program operation.

In another embodiment, a memory system may comprise one or more memory devices, an R/B signal line to carry an R/B signal to indicate whether a program operation is pending, and a fail signal line to carry an asynchronous fail signal to indicate whether the pending program operation has failed to write information to at least a portion of the one or more memory devices. In one implementation, a memory system may further comprise a memory controller to receive an R/B signal and a fail signal from an R/B signal line and a fail signal line, respectively. In another implementation, a memory device may comprise one or more memory arrays and a write state machine, wherein the write state machine may generate a fail signal.

FIG. 1 is a schematic block diagram of a memory system 100, according to an embodiment. Memory system 100 may receive information and/or instructions such as read/program commands from an external host (not shown), for example. Memory system 100 may include an NVM device 110 to store information provided by controller 150 and/or processor 160. NVM device 110 may comprise an array of nonvolatile memory cells and a write state machine 115 to monitor pass/fail status of a most recently pending program operation, for example. In one implementation, fail signal line 125 may carry an asynchronous fail signal provided by write state machine 115. Fail signal line 125 may electrically connect to pass/fail input port P/F at controller 150 and/or pass/fail input port P/F at processor 160. In a particular embodiment, a fail signal may comprise an open-drain signal provided by write state machine 115 and implemented by a power source $V_{dd}$ via pull-up resistor 132, though claimed subject matter is not so limited. Accordingly, write state machine 115 may pull fail signal line 125 low if a program operation fails, while write state machine 115 may allow fail signal line 125 to float if a program operation passes. Failure of a program operation may include failure to write information associated with the program operation to one or more memory cells in NVM device 110, for example. However, failure of a program operation may result from different types of events, and claimed subject matter is not limited in this respect.

In one implementation, fail signal line 125 may operate in conjunction with R/B signal line 122 carrying a ready-busy signal. Similar to fail signal line 125, R/B signal line 122 may electrically connect to ready-busy input port R/B at controller 150 and/or ready-busy input port R/B at processor 160. In a particular embodiment, an R/B signal may comprise an open-drain signal provided by write state machine 115 and implemented by power source $V_{dd}$ via pull-up resistor 134, though claimed subject matter is not so limited. Accordingly, write state machine 115 may pull R/B signal line 122 low if controller 150 and/or processor 160 issues a program operation to write state machine 115, whereas write state machine 115 may allow R/B signal line 122 to float subsequent to completion of the program operation. If a program operation is unsuccessful upon completion, write state machine 115 may pull fail signal line 125 low before allowing R/B signal line 122 to float. After write state machine 115 indicates a program failure and fail signal line 125 is pulled low, controller 150 may reset fail signal line 125 to prepare for a subsequent program operation, for example. In an implementation, fail signal line 125 need not comprise a signal line dedicated to such a fail signal. For example, fail signal line 125 may comprise a general purpose I/O signal line that may be used for a variety of purposes by memory system 100. General purpose I/O signals may be used as P/F signals or R/B signals. General purpose I/O signals may also be used for additional signals to increase data width of a memory device, for example. Of course, such details of a memory system are merely examples, and claimed subject matter is not so limited.

Figure 2:
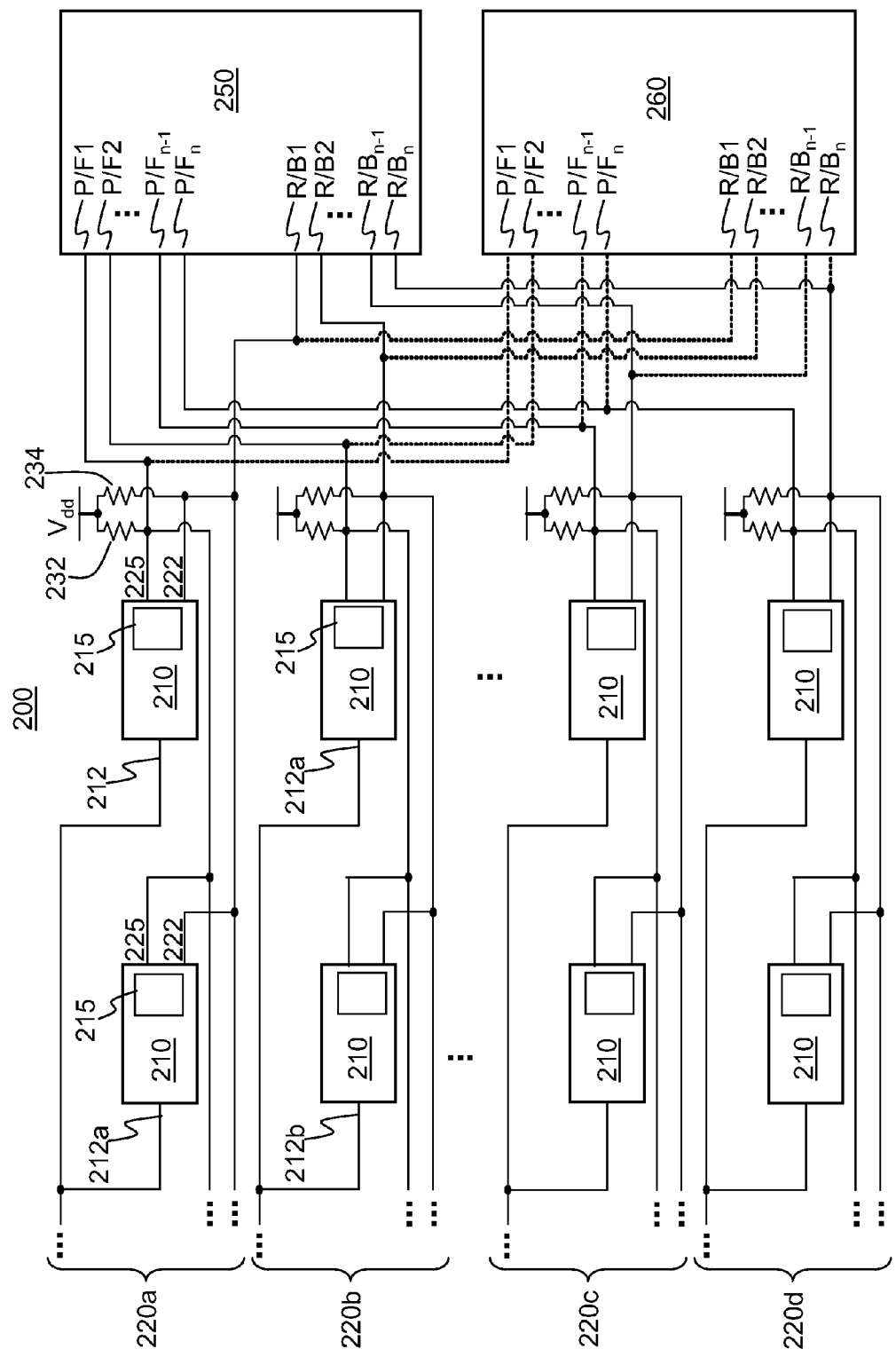
FIG. 2 is a schematic block diagram of a memory device, according to another embodiment.

FIG. 2 is a schematic block diagram of a memory system 200, according to an embodiment. Memory system 200 may receive information and/or instructions such as read/program commands from an external host (not shown), for example. Memory system 200 may include multiple NVM devices 210 arranged in groups 220a, b, c, d, and so on. Though four groups 220 are shown in FIG. 2, any number of such groups may be included in memory system 200, and claimed subject matter is not limited in this respect. A particular group 220 may comprise NVM devices 210 that are connected to a common chip select signal line 212. For example, group 220a may comprise NVM devices 210 that are connected to chip select signal line 212a, whereas group 220b may comprise NVM devices 210 that are connected to chip select signal line 212b, and so on. NVM devices 210 may store information provided by controller 250 and/or processor 260. NVM devices 210 may comprise an array of nonvolatile memory cells and a write state machine 215 to monitor pass/fail status of a most recently pending program operation, for example. In one implementation, a fail signal line 225 may carry an asynchronous fail signal provided by any one or more write state machines 215 of individual NVM devices 210. Fail signal lines 225 from individual NVM devices 210 of a particular group 220 may be electrically coupled together and connected to pass/fail input ports P/F at controller 250 and/or pass/fail input port P/F at processor 260. In particular, group 220a of NVM devices 210 may include fail signal lines 225 electrically coupled together and connected to input port P/F1 at controller 250 and/or input port P/F1 at processor 260. Similarly, group 220b of NVM devices 210 may include fail signal lines 225 electrically coupled together and connected to input port P/F2 at controller 250 and/or input port P/F2 at processor 260. As mentioned above, memory system 200 may comprise additional groups of NVM devices, such as groups 220c and 220d shown in FIG. 2, for a total of n groups. Accordingly, controller 250 and/or processor 260 may comprise n input ports $P/F_n$, for example. Thus, a fail signal on fail signal line 225 may indicate a program failure for any one or more NVM devices 210 in group 220, for example. In a particular embodiment, a fail signal may comprise an open-drain signal provided by write state machine 215 and implemented by power source $V_{dd}$ via pull-up resistor 232, though claimed subject matter is not so limited. Accordingly, any one or more write state machines 215 of a particular group 220 may pull fail signal line 225 low if a program operation fails, while any one or more write state machines 215 may allow fail signal line 225 to float if a program operation passes. Failure of a program operation may include failure to write information associated with the program operation to one or more memory cells in any one or more NVM devices 210, for example.

In one implementation, fail signal line 225 may operate in conjunction with R/B signal line 222 carrying a ready-busy signal. Similar to fail signal lines 225, R/B signal lines 222 from individual NVM devices 210 of a particular group 220 may be coupled together and electrically connect to ready-busy input port R/B at controller 250 and/or ready-busy input port R/B at processor 260. In particular, group 220a of NVM devices 210 may include R/B signal lines 222 electrically coupled together and connected to input port R/B1 at controller 250 and/or input port R/B1 at processor 260. Similarly, group 220b of NVM devices 210 may include R/B signal lines 222 electrically coupled together and connected to input port R/B2 at controller 250 and/or input port R/B2 at processor 260. As mentioned above, memory device 200 may comprise additional groups of NVM devices, such as groups 220c and 220d shown in FIG. 2, for a total of n groups. Accordingly, controller 250 and/or processor 260 may comprise n input ports $R/B_n$, for example. In a particular embodiment, an R/B signal may comprise an open-drain signal provided by any one or more write state machines 215 and implemented by power source $V_{dd}$ via pull-up resistor 234, though claimed subject matter is not so limited. Accordingly, any one or more write state machines 215 may pull R/B signal line 222 low if controller 250 and/or processor 260 issues a program operation to write state machines 215, whereas any one or more write state machines 215 may allow R/B signal line 222 to float subsequent to completion of the program operation. If a program operation is unsuccessful upon completion, any one or more write state machines 215 may pull fail signal line 225 low before allowing R/B signal line 222 to float. After any one or more write state machines 215 indicates a program failure and fail signal line 225 is pulled low, controller 250 may reset fail signal line 225 to prepare for a subsequent program operation, for example. If controller 250 and/or processor 260 detects R/B signal on R/B signal line 222 as a logic high value while detecting a logic high fail signal on fail signal line 225, then program operation may have successfully completed for NVM devices 210 in a particular group 220, for example. In an implementation, as discussed above, fail signal line 225 need not comprise a signal line dedicated to such a fail signal. For example, fail signal line 225 may comprise a general purpose I/O signal line that may be used for a variety of purposes by memory device 200. Of course, such details of a memory device are merely examples, and claimed subject matter is not so limited.

Figure 3:
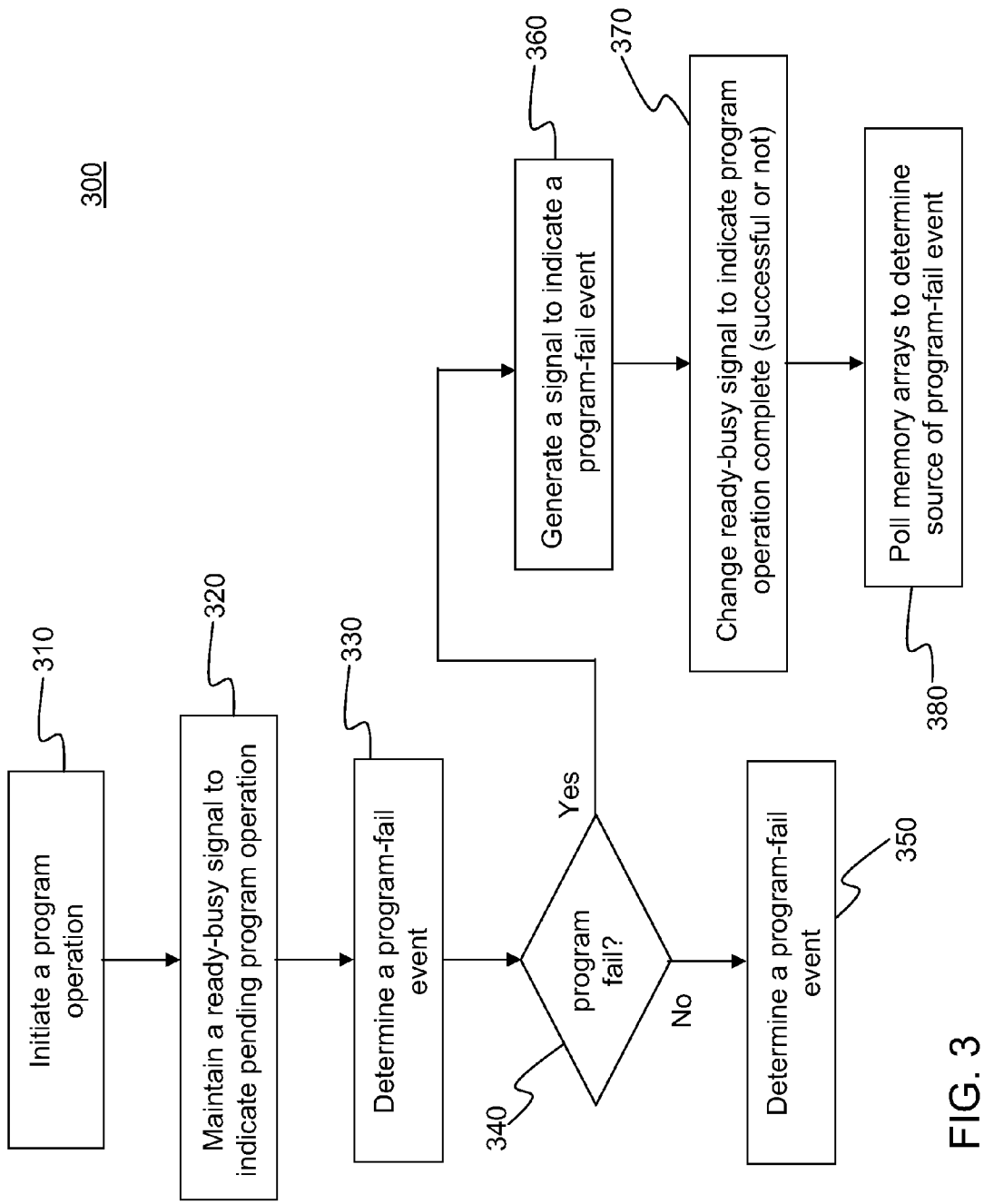
FIG. 3 is a flow diagram of a process to program a memory device, according to an embodiment.

FIG. 3 is a flow diagram of a process 300 to program a memory system, according to an embodiment. At block 310, a processor, for example, may initiate a program operation to store information in an NVM array such as NVM device 110 shown in FIG. 1. During such a program operation, at block 320, a write state machine associated with a particular NVM device may maintain an R/B signal at a value to indicate to a controller or processor of the pending program operation. At block 330, during or subsequent to a program operation, such a write state machine may determine whether a program-fail event has occurred at the particular NVM device in which the write state machine is located. At block 340, if a program-fail has not occurred, process 300 may proceed to block 350 where write state machines of one or more particular groups of NVM devices may provide a signal to a controller and/or processor indicating program completion. Such a signal may comprise an asynchronous R/B signal and/or asynchronous fail signal. For example, R/B signal may be maintained at a logic high value to indicate completion of a program operation. Meanwhile, a fail signal may also be maintained at a logic high value to indicate a successful program operation. At block 340, if a program-fail has occurred, process 300 may proceed to block 360 where write state machines of one or more particular groups of NVM devices may provide a signal to a controller and/or processor indicating a program failure. Such a signal may comprise an R/B signal and/or a fail signal. For example, at block 370, R/B signal may be maintained at a logic high value to indicate a pending program operation or completion of a program operation. In a particular implementation, for example, R/B signal may be implemented using an open-drain configuration so that a logic high value may indicate completion of a program operation. Meanwhile, a fail signal may transition from logic high to logic low value to indicate a failed program operation. A fail event may have occurred at one or more of a plurality of NVM devices, but since fail signal lines from individual NVM devices may be coupled together, a controller and/or processor may not yet know which particular one or more NVM devices are responsible for the failure. Thus, at block 380, a controller and/or processor may poll NVM devices of one or more groups to determine which particular one or more NVM devices led to the failure. Of course, such details of a process 300 are merely examples, and claimed subject matter is not so limited.

In an embodiment, a memory system may apply an error-correcting-code (ECC) process to attempt to correct one or more errors that generate a program-fail event. Such an ECC process, which may be implemented from within a memory device, for example, may be applied before generating a fail signal. In other words, before notifying a controller and/or processor that a program operation was unsuccessful, a state machine may manage an ECC process in attempt to repair one or more errors that resulted in the unsuccessful program operation. If such an ECC process is able to repair the errors, then a fail signal need not be generated and the program operation may conclude successfully. On the other hand, if such an ECC process is not able to repair the errors, then a fail signal may be generated as in block 360 of process 300, for example.

Figure 4:
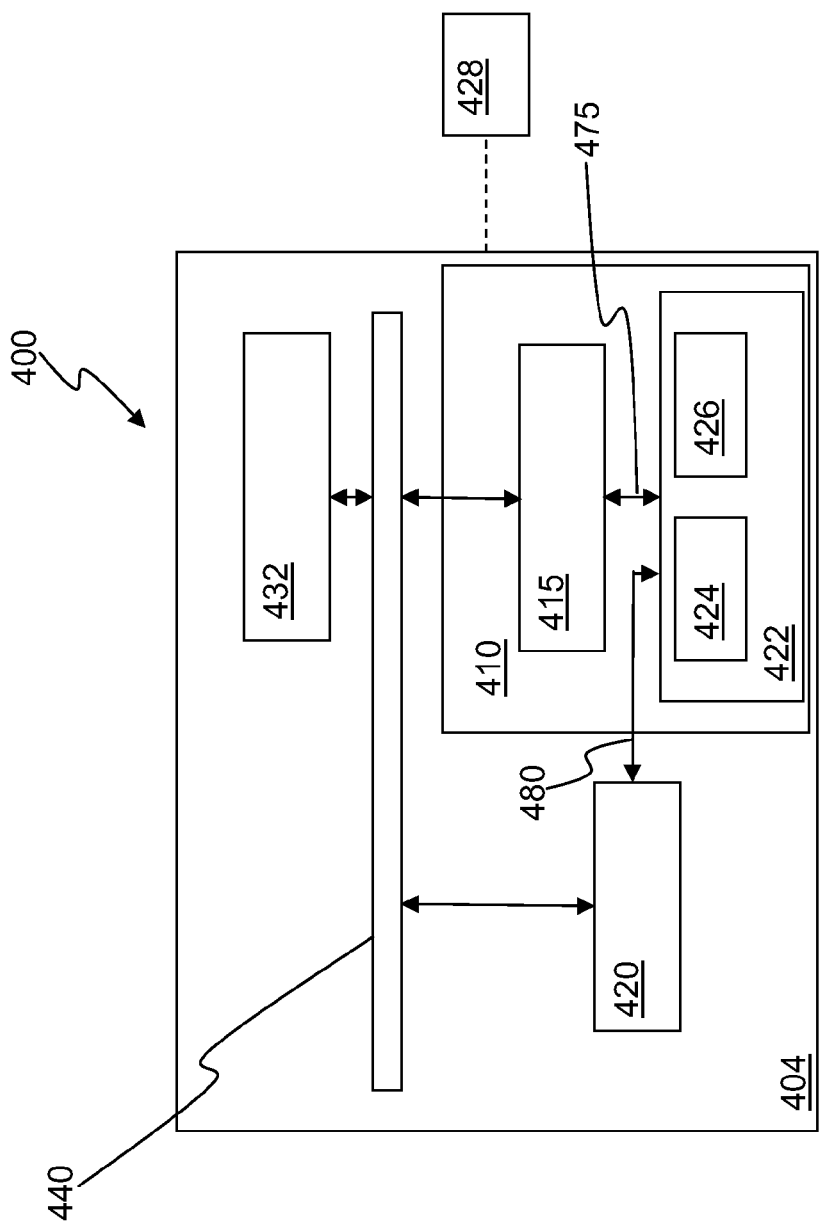
FIG. 4 is a schematic block diagram of a computing system and a memory device, according to an embodiment.

FIG. 4 is a schematic view of a computing system 400 and a memory device, according to an embodiment. Such a computing device may comprise one or more processors, for example, to execute an application and/or other code. For example, memory device 410 may comprise an NVM device 110 shown in FIG. 1. A computing device 404 may be representative of any device, appliance, or machine that may be configurable to manage memory device 410. Memory device 410 may include a memory controller 415 and a memory 422. By way of example but not limitation, computing device 404 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 400, and the processes and methods as further described herein, may be implemented using or otherwise including hardware, firmware, software, or any combination thereof. Thus, by way of example but not limitation, computing device 404 may include at least one processing unit 420 that is operatively coupled to memory 422 through a bus 440 and a host or memory controller 415. Processing unit 420 is representative of one or more circuits configurable to perform at least a portion of a data computing procedure or process. By way of example but not limitation, processing unit 420 may include one or more processors, controllers, microprocessors, microcontrollers, application specific integrated circuits, digital signal processors, programmable logic devices, field programmable gate arrays, and the like, or any combination thereof. Processing unit 420 may include an operating system configured to communicate with memory controller 415. Such an operating system may, for example, generate commands to be sent to memory controller 415 over bus 440. Such commands may comprise read and/or write commands. In response to a write command, for example, memory controller 415 may provide a bias signal, such as a set or reset pulse to write information associated with the write command to a memory partition, for example.

Memory 422 is representative of any data storage mechanism. Memory 422 may include, for example, a primary memory 424 and/or a secondary memory 426, each of which may be partitioned into multiple partitions as discussed above, for example. Primary memory 424 may include, for example, a random access memory, read only memory, etc. While illustrated in this example as being separate from processing unit 420, it should be understood that all or part of primary memory 424 may be provided within or otherwise co-located/coupled with processing unit 420. In one implementation, one or more data lines 475 may comprise a fail signal line and/or an R/B signal line electronically interconnecting memory controller 415 and memory 422. Additionally, one or more data lines 480 may comprise a fail signal line and/or an R/B signal line electronically interconnecting processing unit 420 and memory 422, though claimed subject matter is not so limited.

Secondary memory 426 may include, for example, the same or similar type of memory as primary memory and/or one or more data storage devices or systems, such as, for example, a disk drive, an optical disc drive, a tape drive, a solid state memory drive, etc. In certain implementations, secondary memory 426 may be operatively receptive of, or otherwise configurable to couple to, a computer-readable medium 428. Computer-readable medium 428 may include, for example, any medium that can carry and/or make accessible data, code, and/or instructions for one or more of the devices in system 400.

In one embodiment, system 400 may comprise one or more memory devices, such as memory device 210 shown in FIG. 2, for example. Such a memory device may comprise one or more memory arrays and a write state machine 215, for example. System 400 may comprise an R/B signal line 222 to carry an R/B signal to indicate whether a program operation is pending, and a fail signal line 225 to carry an asynchronous fail signal to indicate whether a pending program operation has failed to write information to at least a portion of one or more memory devices 210. System 400 may further comprise a memory controller 250 to receive an R/B signal and fail signal, and a processor 260 to host one or more applications and to initiate a program operation.

Computing device 404 may include, for example, an input/output 432. Input/output 432 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 432 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
   maintaining a first signal to indicate a pending program operation at a particular group of a plurality of groups of memory devices, each group comprising a plurality of memory devices, each memory device comprising one or more memory arrays;
   at a particular memory device of said particular group:
      applying a programming signal for programming at least one of said one or more memory arrays according to said pending program operation;
      detecting a program-fail event for said at least one of said one or more memory arrays during said pending program operation;
      generating an electronic fail signal to indicate that said program operation was unsuccessful; and
      providing said electronic fail signal to a memory controller or to a processor; and
   polling a plurality of memory devices of said particular group to determine said particular memory device at which said at least one or more memory arrays said program operation was unsuccessful, and
   wherein fail signal lines of a plurality of memory devices of said particular group are electrically coupled and connected to a pass/fail (P/F) input port of at least one of said memory controller or said processor.

2. The method of claim 1, further comprising:
   after said generating said electronic fail signal to indicate that said program operation was unsuccessful, transitioning said first signal to indicate conclusion of said program operation of said one or more memory arrays.

3. The method of claim 1, wherein said one or more memory arrays comprise phase change memory (PCM).

4. The method of claim 1, further comprising:
   before said generating said electronic fail signal to indicate that said program operation was unsuccessful, applying an error-correcting-code (ECC) to attempt to correct one or more errors that generated said program-fail event.

5. A system comprising:
   a plurality of memory devices, each memory device comprising one or more memory arrays and a state machine, said plurality of memory devices arranged in a plurality of groups;
   a ready-busy (R/B) signal line configured to carry an R/B signal to at least one of a memory controller or a processor, said R/B signal to indicate whether a write operation is pending at a particular group of said plurality of groups;
   a fail signal line configured to carry a fail signal to at least one of said memory controller or said processor, said fail signal to indicate whether said pending write operation has failed to write information to at least a portion of one or more memory arrays of at least one memory device of the particular group after applying a bias signal for writing information to said at least a portion of said one or more memory arrays according to said pending write operation,
   wherein said state machine is configured to generate and to provide said fail signal to said fail signal line, and
   wherein at least one of said memory controller or said processor is configured to poll a plurality of memory devices of said particular group to determine at which said at least a portion of said one or more memory arrays the write operation has failed.

6. The system of claim 5, wherein said R/B signal line and said fail signal line are connected to said one or more memory arrays of each of said plurality of memory devices.

7. The system of claim 5, further comprising said memory controller.

8. The system of claim 5, further comprising said processor.

9. The system of claim 5, wherein said one or more memory arrays comprise phase change memory (PCM).

10. The system of claim 5, wherein each memory device comprises an error-correcting-code (ECC) portion configured to attempt to correct one or more write-errors before said fail signal is generated.

11. The system of claim 5, wherein said R/B signal and said fail signal comprise open-drain signals.

12. The system of claim 5, wherein said particular group has a common chip select line to select said one or more memory arrays of said at least one memory device for said write operation.

13. A system comprising:
   a processor to host one or more applications and to initiate a write operation;
   a memory controller to perform said write operation; and a plurality of memory devices arranged in a group, each of the memory devices comprising:
one or more memory arrays;
a ready-busy (R/B) signal line to carry an R/B signal to indicate whether said write operation is pending;
a state machine configured to generate and to provide a fail signal to said memory controller or to said processor, said fail signal to indicate whether said pending write operation has failed to write information to at least a portion of said one or more memory arrays after applying a bias signal for writing information to said at least a portion of said one or more memory arrays according to said pending write operation; and
a fail signal line to carry said fail signal to at least one of said memory controller or to said processor;
wherein fail signal lines of said plurality of memory devices of said group are electrically coupled and connected to a pass/fail (P/F) input port of at least one of said memory controller or said processor, and
wherein at least one of said memory controller or said processor is configured to poll said plurality of memory devices of said group to determine at which memory device the fail signal was generated.

14. The system of claim 13, said processor to receive said R/B signal and said fail signal in parallel with said memory controller.

15. The system of claim 13, further comprising an error-correcting-code (ECC) portion to attempt to correct one or more write-errors before said fail signal is generated.

16. The system of claim 13, wherein said one or more memory arrays comprise phase change memory (PCM).

17. The system of claim 13, wherein said group has a common chip select line to select said one or more memory arrays a particular memory device of said plurality of memory devices for said write operation.

18. The method of claim 1, wherein said memory controller and said processor are located external to said plurality of groups of memory devices.

19. The memory device of claim 5, wherein said memory controller and said processor are located external to said plurality of groups of memory devices.

* * * * *

UNITED STATES PATENT AND TRADEMARK OFFICE
CERTIFICATE OF CORRECTION

| | | |
|---|---|---|
| PATENT NO. | : 8,683,270 B2 | |
| APPLICATION NO. | : 12/770599 | |
| DATED | : March 25, 2014 | |
| INVENTOR(S) | : Bueb et al. | |

It is certified that error appears in the above-identified patent and that said Letters Patent is hereby corrected as shown below:

In the Claims

Column 10, line 18, Claim 19, delete "memory device" and insert -- system --, therefor.

Signed and Sealed this
Twenty-eighth Day of October, 2014

Michelle K. Lee
*Deputy Director of the United States Patent and Trademark Office*